(12) United States Patent
Coon

(10) Patent No.: US 7,121,840 B1
(45) Date of Patent: Oct. 17, 2006

(54) SUSPENSION WITH NO-SOLDER, NO-RESIN CONDUCTOR EXTENDING THROUGH INSULATOR-SPACED METAL LAYERS

(75) Inventor: Warren Coon, Temecula, CA (US)

(73) Assignee: Magnecomp Corporation, Temecula, CA (US)

( * ) Notice: Subject to any disclaimer, the term of this patent is extended or adjusted under 35 U.S.C. 154(b) by 0 days.

(21) Appl. No.: 11/395,400

(22) Filed: Mar. 30, 2006

Related U.S. Application Data

(63) Continuation-in-part of application No. 10/177,538, filed on Jun. 21, 2002.

(60) Provisional application No. 60/386,572, filed on Jun. 5, 2002.

(51) Int. Cl.
*H01R 12/00* (2006.01)

(52) U.S. Cl. ....................................................... 439/67

(58) Field of Classification Search .................. 439/84, 439/67, 69, 74; 174/262, 263; 360/104, 360/244
See application file for complete search history.

(56) References Cited

U.S. PATENT DOCUMENTS

| | | | |
|---|---|---|---|
| 3,674,914 A * | 7/1972 | Burr | 174/261 |
| 3,798,419 A | 3/1974 | Maake | |
| 3,880,486 A | 4/1975 | Avakian | |
| 3,964,813 A | 6/1976 | Pizzeck | |
| 3,980,367 A | 9/1976 | Laserson et al. | |
| 4,446,505 A | 5/1984 | Long et al. | |
| 4,584,433 A | 4/1986 | Bowsky et al. | |
| 5,082,460 A | 1/1992 | Legrady | |
| 5,189,261 A | 2/1993 | Alexander et al. | |
| 5,239,135 A | 8/1993 | Phillips, II | |
| 5,952,716 A | 9/1999 | Dibble et al. | |
| 6,205,003 B1 * | 3/2001 | Iwamoto | 360/245.9 |
| 6,382,988 B1 | 5/2002 | Rugg et al. | |
| 6,411,516 B1 | 6/2002 | Palumbo et al. | |
| 6,515,832 B1 * | 2/2003 | Girard | 360/245.3 |
| 6,636,383 B1 * | 10/2003 | Chew | 360/245.9 |
| 6,647,621 B1 | 11/2003 | Roen et al. | |

* cited by examiner

*Primary Examiner*—Briggitte R. Hammond
(74) *Attorney, Agent, or Firm*—Louis J. Bachand

(57) ABSTRACT

A resin free and solder free electrical connection in a disk drive suspension interconnect is provided including an electrical connection between conductive traces of a first metal layer and a second metal layer with a conductor pin having electrical connection with the outer surfaces of each metal layer and free of any solder and resin in making the connection.

11 Claims, 1 Drawing Sheet

SUSPENSION WITH NO-SOLDER, NO-RESIN CONDUCTOR EXTENDING THROUGH INSULATOR-SPACED METAL LAYERS

CROSS-REFERENCE TO RELATED APPLICATIONS

This application is a continuation-in-part of U.S. application Ser. No. 10/177,538, filed Jun. 21, 2002, which claims the benefit of U.S. Provisional Application Ser. No. 60/386,572, filed Jun. 5, 2002.

BACKGROUND OF THE INVENTION

1. Field of the Invention

This invention relates to additive and non-additive types of electrical interconnects for disk drive suspensions, and, more particularly, relates to improvements in the provision of electrical connections between conductive traces and a grounding metal in flexible circuit interconnects where the traces are spaced from a grounded metal layer by an intervening insulative layer, and no resin-based or solder-based electrical connection is used to effect the electrical connection, but a pin in mechanical contact with the outer surfaces is used to effect electrical connection.

2. Description of the Related Art

In the manufacture of disk drive suspensions an electrical interconnect is used to connect the slider with the device electronics. The electrical interconnect typically comprises a laminate of a first metal layer that is deposited in an additive assembly or etched in a subtractive assembly or otherwise formed into a plurality of conductive traces on an insulative layer of plastic such as polyimide film, and optionally a second metal layer of, for example, stainless steel or copper that is sufficient to provide a contact locus for electrical connection. The second metal layer or similar structure such as a pad can be used for connection of the interconnect to ground. To effect a grounding link, the trace conductors or a pad connected to the trace conductors is electrically connected to the second metal layer or similar structure that is grounded. This connection has been effected by filling an aperture that extends between the first and second metal layers through the insulative layer with a conductive resin, such as silver-filled epoxy, or solder supported or not by a stud within the aperture. The filled resin or solder is convenient and effective, but increasing awareness of chemical contamination of parts and environmental health hazards inherent in the use of the resins dictate finding a better system for making these interlayer electrical connections.

BRIEF SUMMARY OF THE INVENTION

It is an object of the invention to provide a resin-free and solder-free electrical connection in a disk drive suspension interconnect extending between the outer surfaces of the respective metal layers. It is a further object to provide an electrical connection between conductive traces and a second metal layer with a conductor structure such as a pin that has deflected terminal portions to contact both the first metal layer contact locus connected to traces of the first metal layer and the outer surface of the second metal layer while extending through a shaft terminating in the outer surfaces and passing through the insulative layer.

These and other objects of the invention are realized in an electrical interconnect for a disk drive suspension comprising a laminate of a first conductive metal layer defining at least one conductive trace and having an inner surface and an outer surface with a contact locus, a second metal layer spaced from the first metal layer and the contact locus and having an inner surface and an outer surface, and an insulative layer therebetween and bonded respectively to the first and second metal layer inner surfaces, and a conductor electrically connecting the first and second layers, the conductor comprising a pin having a first terminal portion in electrical contact with the first layer outer surface contact locus and a second terminal portion in electrical contact with the second layer outer surface, the conductor and electrical connection being free of resin and solder.

In this and like embodiments, typically, the laminate has a lateral extension, the contact locus and the pin first terminal, portion being located on the lateral extension, the first metal layer defines the contact locus including an aperture in its the outer surface, the aperture being of a given diameter, the pin first terminal portion having an enlarged portion greater than the given diameter to oppose the contact locus with the pin registered with the aperture, the second metal layer outer surface defines an aperture sized to receive the pin but not the pin second terminal portion, the pin comprises conductive stainless steel, and/or the interconnect is an additive assembly of deposited conductive traces forming the first metal layer on the insulative layer supported on the second metal layer. In a further embodiment, the first metal layer defines the contact locus including an aperture in its outer surface, the aperture being of a given diameter, the pin first terminal portion having an enlarged portion greater than the given diameter to oppose the contact locus with the pin registered with the aperture, the second metal layer outer surface defines an aperture sized to receive the pin but not the pin second terminal portion, the pin comprises stainless steel wire whose ends are deflected to oppose at least one of the first and second metal layer outer surfaces, and the interconnect is an additive assembly of deposited conductive traces forming the first metal layer on the insulative layer supported on the second metal layer.

In its method aspects the invention provides a method of electrically connecting spaced metal layers of an electrical interconnect for a disk drive suspension, including selecting as the interconnect a laminate comprising a first conductive metal layer having an inner and an outer surface and defining at least one conductive trace having a contact locus, a second metal layer spaced from the first metal layer and the contact locus and having an inner and an outer surface, and an insulative layer laminated to the first and second metal layer inner surfaces, extending between the first metal layer outer surface contact locus and the second metal layer outer surface a preformed conductor to have its first terminal portion electrically connected to the contact locus and its second terminal portion electrically connected to the second metal layer outer surface in electrically connecting relation and free of the presence of solder or resin in the electrical connections.

BRIEF DESCRIPTION OF THE SEVERAL VIEWS OF THE DRAWINGS

The invention will be further described in conjunction with the attached drawings in which.

DETAILED DESCRIPTION OF THE INVENTION

The invention provides alternatives to resin and/or solder-based electrical connection between spaced metal layers and overcomes the disadvantages of the prior art while making the necessary contact between layers, comprising a preformed conductor such as and including a soft stainless steel wire threaded through the first layer and the second layer to oppose the respective layer outer surfaces while extending through a hole in the insulative layer, The stainless steel layer has a through hole coaxial with the typical copper annulus contact locus and insulative layer hole. The wire is formed to have a terminal deflection forming a widened end or head similar to a rivet that will oppose and connect with the annulus and with the outer surface of the second metal layer comprising usually a stainless steel layer electrically and mechanically by crimping or other mechanical means or by welding in place.

The copper annulus when present is desirably overplated with nickel and gold where it will be exposed to the environment as is usual with such parts.

The term "metal layer" herein refers to a fully or partially longitudinally and/or laterally extended web of metal, as well as to a portion of such a web sufficient to define an electrical contact point for an electrical connection to a non-layer component.

Figure 1:
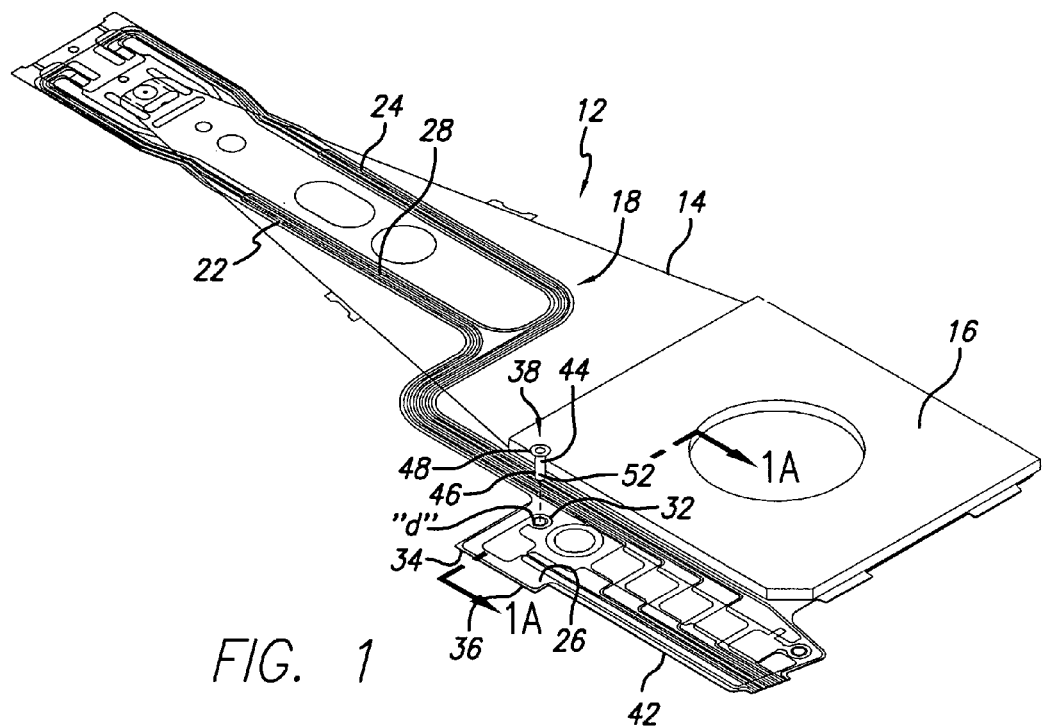
FIG. 1 is an oblique view of the invention electrical interconnect.
Figure 1A:
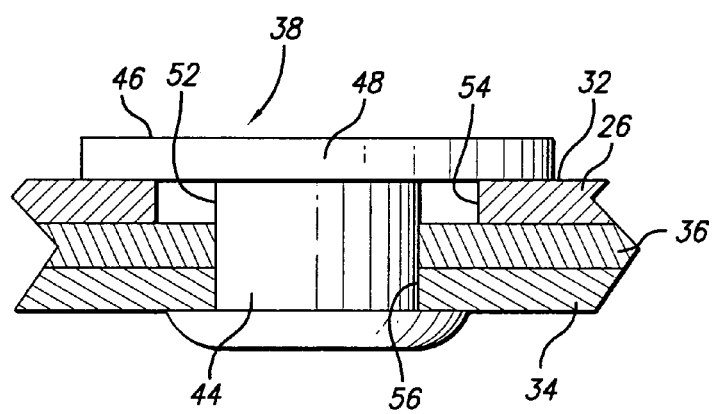
FIG. 1A is a view taken on line 1A—1A in FIG. 1.

With reference now to the drawings in detail, in FIGS. 1 and 1A a disk drive suspension 12 has a load beam 14, a mount plate 16, and an electrical conductor 18 including an electrical interconnect 22. Interconnect 22 comprises a laminate 24 of a first (upper) conductive metal layer 26, typically deposited in its shape in an additive process rather than etched into shape as done in the subtractive process, defining at least one conductive trace 28 and having a contact locus 32, a second (lower) metal layer 34 spaced from the first metal layer and the contact locus, and an insulative layer 36 therebetween, and a solder- and resin-free conductor 38 locally electrically connecting the first metal layer trace contact locus and second metal layer in their spaced relation.

Laminate 24 has a lateral extension 42. Contact locus 32 is located on the lateral extension 42. The solder- and resin-free conductor 38 comprises a metal element 44 in electrical contact with the contact locus 32 and with the second metal layer 34 in insulative layer 36 passing relation. The metal element 44 comprises an elongated pin 46 that is sufficiently long to extend through the respective first and second metal layers to and through their outer layers as well as the insulative layer 36 (which is bonded to the metal layer inner surfaces as shown) for electrical contact with the metal layers outer surfaces as shown. Metal element 44 is suitably comprised of stainless steel and is in any case conductive and preformed before insertion to the extent necessary to contact the contact locus and the second metal layer aperture 56 as follows: Pin 46 has a deflected and locally enlarged portion 48 in electrical contact with the contact locus 32, and an axially extended portion 52, suitably also comprising a deflected terminal portion of the pin in electrical contact with the outer surface of second metal layer 34.

The contact locus 32 comprises a first metal layer aperture 54 of a given diameter d; the pin enlarged portion 48 is sized to register, preferably fully, but at least in part with, or overlie, the aperture 54 and make an electrically conductive contact, i.e. be in electrical contacting relation with the locus 32.

The second metal layer 34 has an aperture 56 sized to slidably receive the pin 46 axially extended portion 52, also in electrical contacting relation.

The invention method includes, with illustrative reference to FIGS. 1 and 1A, selecting as the interconnect 22 a laminate 24 comprising a first conductive metal layer 26 having an inner and an outer surface and defining at least one conductive trace 28 and having the contact locus 32, a second metal layer 34 spaced from the first metal layer and the contact locus and having an inner and outer surface, and an insulative layer 36 therebetween, extending between the first metal layer outer surface contact locus and the second metal layer outer surface a solder- and resin-free conductor 38 to have its first terminal portion electrically connected to the second metal layer outer surface in electrically connecting relation and free of the presence of solder or resin in the electrical connections.

The invention thus provides a solder- and resin-free electrical connection in a disk drive suspension interconnect including an electrical connection between conductive traces and a second metal layer with a conductor structure such as a pin that has a head contacting the upper contact locus and a shaft contacting the second metal layer after passing through the insulative layer.

The foregoing objects are thus met.

I claim:

1. An electrical interconnect for a disk drive suspension, said interconnect comprising a laminate of a first conductive metal layer defining at least one conductive trace and having an inner surface and an outer surface with a contact locus, a second metal layer spaced from said first metal layer and said contact locus and having an inner surface and an outer surface, and an insulative layer therebetween and bonded respectively to said first and second metal layer inner surfaces, and a conductor electrically connecting said first and second layers, said conductor comprising a pin having a first terminal portion in electrical contact with said first layer outer surface contact locus and a second terminal portion in electrical contact with said second layer outer surface, said conductor and electrical connection being free of resin and solder.

2. The electrical interconnect according to claim 1, in which said first metal layer defines said contact locus including an aperture in its said outer surface, said aperture being of a given diameter, said pin first terminal portion having an enlarged portion greater than said given diameter to oppose said contact locus with said pin registered with said aperture.

3. The electrical interconnect according to claim 1, in which said second metal layer outer surface defines an aperture sized to receive said pin but not said pin second terminal portion.

4. The electrical interconnect according to claim 1, in which said pin comprises stainless steel.

5. The electrical interconnect according to claim 1, in which said interconnect is an additive assembly of deposited conductive traces forming said first metal layer on said insulative layer supported on said second metal layer.

6. The electrical interconnect according to claim 1, in which said laminate has a lateral extension, said contact locus and said pin first terminal, portion being located on said lateral extension.

7. The electrical interconnect according to claim 6, in which said first metal layer defines said contact locus including an aperture in its said outer surface, said aperture being of a given diameter, said pin first terminal portion having an enlarged portion greater than said given diameter to oppose said contact locus with said pin registered with said aperture.

8. The electrical interconnect according to claim 7, in which said second metal layer outer surface defines an aperture sized to receive said pin but not said pin second terminal portion.

9. The electrical interconnect according to claim 8, in which said pin comprises stainless steel wire whose ends are deflected to oppose at least one of said first and second metal layer outer surfaces.

10. The electrical interconnect according to claim 9, in which said interconnect is an additive assembly of deposited conductive traces forming said first metal layer on said insulative layer supported on said second metal layer.

11. A method of electrically connecting spaced metal layers of an electrical interconnect for a disk drive suspension, including selecting as said interconnect a laminate comprising a first conductive metal layer having an inner and an outer surface and defining at least one conductive trace having a contact locus, a second metal layer spaced from said first metal layer and said contact locus and having an inner and an outer surface, and an insulative layer laminated to said first and second metal layer inner surfaces, extending between said first metal layer outer surface contact locus and said second metal layer outer surface a preformed conductor to have its first terminal portion electrically connected to said contact locus and its second terminal portion electrically connected to said second metal layer outer surface in electrically connecting relation and free of the presence of solder or resin in said electrical connections.

* * * * *